(12) United States Patent
Li et al.

(10) Patent No.: US 10,504,723 B2
(45) Date of Patent: Dec. 10, 2019

(54) METHOD AND APPARATUS FOR SELECTIVE EPITAXY

(71) Applicant: Applied Materials, Inc., Santa Clara, CA (US)

(72) Inventors: Xuebin Li, Sunnyvale, CA (US); Hua Chung, San Jose, CA (US); Flora Fong-Song Chang, Saratoga, CA (US); Schubert S. Chu, San Francisco, CA (US); Abhishek Dube, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/661,124

(22) Filed: Jul. 27, 2017

(65) Prior Publication Data
US 2018/0190489 A1 Jul. 5, 2018

Related U.S. Application Data

(60) Provisional application No. 62/442,753, filed on Jan. 5, 2017.

(51) Int. Cl.
| | |
|---|---|
| *H01L 21/02* | (2006.01) |
| *H01L 29/167* | (2006.01) |
| *H01L 21/306* | (2006.01) |
| *C30B 25/18* | (2006.01) |
| *C30B 29/10* | (2006.01) |
| *C23C 16/38* | (2006.01) |

(52) U.S. Cl.
CPC ........ *H01L 21/02639* (2013.01); *C23C 16/38* (2013.01); *C30B 25/186* (2013.01); *C30B 29/10* (2013.01); *H01L 21/02381* (2013.01); *H01L 21/02488* (2013.01); *H01L 21/02532* (2013.01); *H01L 21/02576* (2013.01); *H01L 21/02579* (2013.01); *H01L 21/02592* (2013.01); *H01L 21/02614* (2013.01); *H01L 21/30604* (2013.01); *H01L 29/167* (2013.01); *H01L 21/02661* (2013.01)

(58) Field of Classification Search
CPC ........ H01L 21/02488; H01L 21/02639; H01L 21/02359; H01L 21/02362; H01L 21/02532; H01L 21/67098
See application file for complete search history.

(56) References Cited

U.S. PATENT DOCUMENTS

| | | | |
|---|---|---|---|
| 6,429,084 B1 | 8/2002 | Park et al. | |
| 7,312,128 B2 | 12/2007 | Kim et al. | |
| 8,293,658 B2 * | 10/2012 | Shero | B82Y 30/00 438/763 |
| 9,064,960 B2 | 6/2015 | Lam et al. | |
| 2007/0134821 A1 | 6/2007 | Thakur et al. | |

(Continued)

OTHER PUBLICATIONS

International Search Report and Written Opinion for Application No. PCT/US2017/067085 dated Apr. 16, 2018.

*Primary Examiner* — Jamie C Niesz
(74) *Attorney, Agent, or Firm* — Patterson + Sheridan LLP

(57) ABSTRACT

A method of forming a film on a substrate having silicon surfaces and dielectric surfaces includes precleaning the substrate; applying an inhibitor species to the dielectric surfaces; and exposing the substrate to a precursor while maintaining a temperature of less than about 600 degrees Celsius.

12 Claims, 2 Drawing Sheets

(56) References Cited

U.S. PATENT DOCUMENTS

| | | | |
|---|---|---|---|
| 2009/0215240 A1* | 8/2009 | Kim | H01L 21/82380 438/300 |
| 2011/0198736 A1 | 8/2011 | Shero et al. | |
| 2012/0210932 A1* | 8/2012 | Hekmatshoar-Tabari | C30B 25/105 117/103 |
| 2014/0227867 A1 | 8/2014 | Rachmady et al. | |
| 2014/0227871 A1* | 8/2014 | Boussie | B82Y 30/00 438/653 |
| 2014/0231998 A1* | 8/2014 | Kuo | H01L 21/76832 257/751 |
| 2016/0141175 A1* | 5/2016 | Yan | H01L 21/02046 438/509 |
| 2016/0300715 A1 | 10/2016 | Dube et al. | |

* cited by examiner

METHOD AND APPARATUS FOR SELECTIVE EPITAXY

BACKGROUND

Field

Embodiments of the disclosure generally relate to the field of semiconductor manufacturing processes and devices, more particularly, to methods of depositing silicon- or germanium-containing films for forming semiconductor devices.

Description of the Related Art

In general, selective epitaxy processes permit growth of epitaxial layers on a silicon surface with minimized epitaxial layer growth on a dielectric surface (e.g., oxides or nitrides). In order to maintain selectivity (i.e., to achieve preferential crystalline growth on silicon surfaces of the substrate with minimal growth on dielectric surfaces) during the epitaxy process, the deposition gases, halogen precursor, and reaction temperatures may be regulated and adjusted throughout the epitaxy process.

Current selective epitaxy processes have some drawbacks. To maintain selectivity during present epitaxial processes, chemical concentrations of the precursors and/or reaction temperatures must be regulated and adjusted throughout the deposition process. If not enough silicon precursor is administered, then the etching reaction may dominate, and the overall process is slowed down. Also, harmful over-etching of substrate features may occur. If not enough etchant precursor is administered, then the deposition reaction may dominate reducing the selectivity to form monocrystalline and polycrystalline materials across the substrate surface. Also, current selective epitaxy processes usually require a high reaction temperature, such as above 800° C. or higher. Such high temperatures are not desirable during some fabrication processes due to thermal budget considerations and possible uncontrolled nitridation reactions to the substrate surface. In addition, processing in the conventional manner with simultaneous deposition and etching at temperatures lower than about 800° C. results in unacceptably low growth rates in some cases.

Selective epitaxy processes may become even more challenging at lower growth temperatures, for example at or below about 600° C. At such temperatures, hydrogen chloride (HCl) dissociation efficiency becomes poor. As a result, amorphous silicon (aSi) or amorphous germanium (aGe) nucleation may occur on dielectric surfaces (e.g., $SiO_2$ or SiN). Therefore, there is a need to have a process for selectively and epitaxially depositing silicon- or germanium-containing compounds while maintaining low process temperatures, such as about 600° C. or less.

SUMMARY

In one or more embodiments disclosed herein, a method of forming a film on a substrate having silicon surfaces and dielectric surfaces includes precleaning the substrate; applying an inhibitor species to the dielectric surfaces; and exposing the substrate to a precursor while maintaining a temperature of less than about 600 degrees Celsius.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
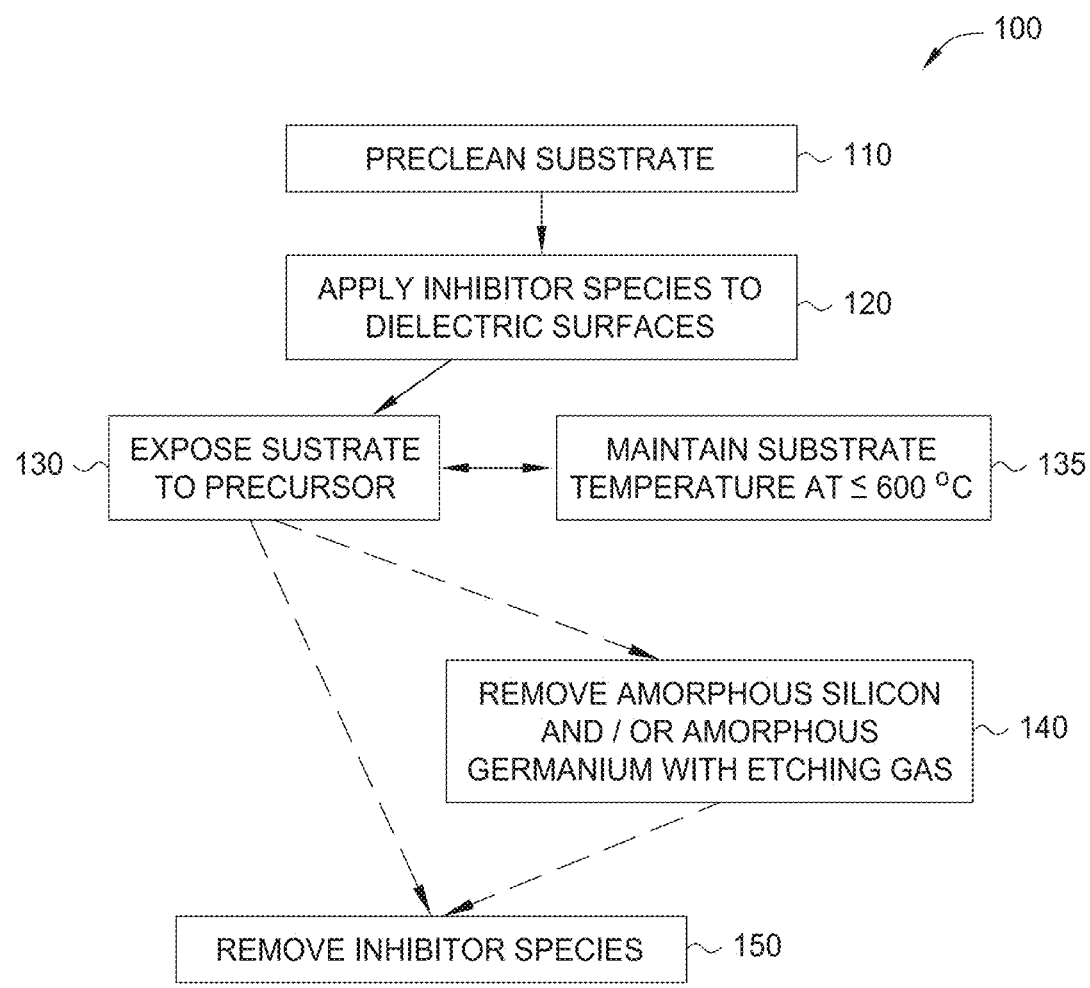
FIG. 1 illustrates a sequence of processes that may be applicable in one or more embodiments.

Embodiments disclosed herein include methods and apparatuses for attaching/removing an inhibitor species to/from selected surfaces of a substrate, such as dielectric surfaces. Such attached inhibitor species may impede the nucleation of source precursors on the selected surfaces during the following epitaxial film deposition. As a result, selective epitaxy at lower temperatures may be achieved due to the selective nature of the blocker chemistry of the inhibitor species.

Embodiments disclosed herein generally provide processes to selectively and epitaxially deposit silicon- or germanium-containing materials on surfaces of a substrate during fabrication of electronic devices. The substrate surface may have both a monocrystalline surface (e.g., silicon or silicon germanium; doped or undoped with boron, phosphorus, arsenic, etc.) and a dielectric surface (e.g., $SiO_2$ or SiN). An inhibitor species may be applied to the substrate surface. The inhibitor species may preferentially attach to dielectric surfaces. The inhibitor species may also be thermally stabile during the following epitaxial deposition processes. The inhibitor species may also be removable with little or no damage to the underlying surface.

Throughout the application, the terms "silicon- or germanium-containing" materials, compounds, films or layers should be construed to include a composition containing at least silicon or germanium, and may also contain carbon, boron, arsenic, phosphorus, gallium, and/or aluminum. Other elements, such as metals, halogens or hydrogen may be incorporated within a silicon- or germanium-containing material, compound, film or layer, usually in part per million (ppm) concentrations. Compounds or alloys of silicon- or germanium-containing materials may be represented by an abbreviation, such as Si for silicon, Ge for germanium, SiGe for silicon germanium, SiC for silicon carbon, and SiGeC for silicon germanium carbon. The abbreviations do not represent chemical equations with stoichiometric relationships, nor represent any particular reduction/oxidation state of the silicon- or germanium-containing materials.

According to one or more embodiments, the epitaxial process includes repeating a cycle of a deposition process and an etching process until the desired thickness of an epitaxial layer is grown. In some embodiments, an inhibitor application process may precede the first cycle of the epitaxial process. In some embodiments, an inhibitor application process may precede the deposition process in multiple cycles of the epitaxial process.

In one or more embodiments, the deposition process includes exposing the substrate surface to a precursor, such as a deposition gas containing at least a silicon or germanium source. Typically, the deposition gas will also contain a carrier gas. In one or more embodiments, the deposition gas may also include carbon source as well as a dopant source. During the deposition process, an epitaxial layer may be formed on the monocrystalline surface of the substrate while little or no silicon or germanium—either crystalline or amorphous—is formed on dielectric surfaces.

In one or more embodiments, the etching process includes exposing the substrate to an etching gas. Typically, the etching gas includes a carrier gas and an etchant, such as chlorine gas or hydrogen chloride. The etching gas may remove silicon- or germanium-containing materials deposited during the deposition process. According to certain embodiments, during the etching process, the inhibitor species may be removed at a faster rate than the epitaxial layer. Therefore, the net result of the deposition and etching processes forms epitaxially grown silicon- or germanium-containing material on monocrystalline surfaces while minimizing growth, if any, silicon- or germanium-containing material on the dielectric surfaces. In one or more embodiments, the pressure within the processing chamber is adjusted between the deposition and etching steps so that the pressure may be higher during etching than during deposition. According to one or more embodiments, the increased pressure may result in an increase in the substrate temperature. In other embodiments, the gas distribution to certain zones of the processing chamber may be adjusted and varied between the deposition and etching steps. A cycle of the deposition and etching processes may be repeated as needed to obtain the desired thickness of silicon- or germanium-containing materials. The silicon- or germanium-containing materials which can be deposited by embodiments of the invention include silicon, germanium, silicon germanium, silicon carbon, silicon germanium carbon, and dopant variants thereof.

In an embodiment, use of chlorine gas as an etchant may lower the overall process temperature below about 600° C. In general, deposition processes may be conducted at lower temperatures than etching reactions, since etchants often need a high temperature to be activated. For example, silane may be thermally decomposed to deposit silicon at about 500° C. or less, while hydrogen chloride may require an activation temperature of about 700° C. or higher to act as an effective etchant. Therefore, if hydrogen chloride is used during the process, the overall process temperature may be dictated by the higher temperature required to activate the etchant. Chlorine may contribute to the overall process by reducing the required overall process temperature. Chlorine may be activated at a temperature as low as about 300° C. Therefore, by incorporating chlorine into the process as the etchant, the overall process temperature may be significantly reduced, such as by 300° C. to 400° C., over processes which use hydrogen chloride as the etchant. Also, chlorine etches silicon- or germanium-containing materials faster than hydrogen chloride. Therefore, chlorine etchants may increase the overall rate of the process.

The carrier gas may be any suitable inert gas or hydrogen. Although noble gasses, such as argon or helium, may be used as an inert carrier gas, according to certain embodiments, nitrogen may be the economically preferred inert carrier gas. One drawback that may occur from using nitrogen as a carrier gas is the nitridizing of materials on a substrate during deposition processes. However, high temperature, such as greater than 800° C., may be required to activate nitrogen in such a manner. Therefore, in one or more embodiments, nitrogen may be used as an inert carrier gas in processes conducted at temperatures below the nitrogen activation threshold. The combined effect of using chlorine as an etchant and nitrogen as a carrier gas may greatly increases the rate of the overall process.

FIG. 1 illustrates a sequence of processes that may be applicable in one or more embodiments. The method 100 begins at step 110 wherein the substrate is precleaned. For example, the substrate may be a wafer having native oxides. In some embodiments, the native oxides may be cleaned from the wafer using a SiCoNi™ Preclean chamber available from Applied Materials of Santa Clara, Calif. The SiCoNi™ Preclean process may remove native oxides through a low-temperature, two-step dry chemical clean process using $NF_3$ and $NH_3$. In some embodiments, the native oxides may be cleaned from the wafer need using a chamber or method disclosed in U.S. Pat. Nos. 7,288,491 and 7,291,545 to Collins et al. In some embodiments, step 110 may include additional preparation steps. For example, step 110 may also include pre-baking the wafer. The wafer may be exposed to $H_2$ during the pre-bake to further clean the surface. The pre-bake may be done in an Epi chamber. The pre-bake may include raising the temperature of the substrate to about 600° C.-800° C. In some embodiments, step 110 includes an HF clean of the substrate, which may result in —H terminations on the silicon (monocrystalline) surfaces and —OH termination on the oxide (dielectric) surfaces.

The method 100 continues at step 120 wherein an inhibitor species is applied to the exposed dielectric surfaces. For example, the inhibitor species may be a blocker layer applied to exposed $SiO_2$ and SiN surfaces. The inhibitor species may be applied to the surface of the substrate and preferentially attach to the dielectric surfaces. For example, there may be passivation of the blocker layer on the dielectric surfaces, but little or no passivation of the blocker layer on the monocrystalline surfaces. The inhibitor species may be applied to the substrate in a blocker chemistry chamber. The blocker layer may be a monolayer. The inhibitor species may result from exposing the substrate to a wide range of molecules, such as trichlorosilane, trialkoxysilanes, or silylamines. The inhibitor species may include carbon. The inhibitor species may include a polymer, for example, a long chain molecule or a short chain molecule. The blocker chemistry chamber may be integrated onto the same mainframe as the preclean chamber. In some embodiments, the inhibitor species preferentially reacts with —OH terminated oxide (dielectric) surfaces, while minimally reacting with —H terminated silicon (monocrystalline) surfaces.

The method 100 continues at step 130 wherein the substrate is exposed to a precursor for epitaxial deposition of a silicon- or germanium-containing layer. Examples of epitaxial deposition processes include silicon (Si), silicon carbon (SiC), silicon phosphorus (SiP), silicon germanium (SiGe), silicon germanium boron (SiGeB), silicon boron (SiB), germanium (Ge), germanium boron (GeB), and germanium phosphorus (GeP). In some embodiments, while the substrate is exposed to the precursor, the method 100 includes adjusting the conditions within an Epi chamber to a desired temperature and pressure. For example, the method 100 may include the step 135 of maintaining the substrate at a temperature of no more than about 600° C. In some embodiments, the substrate temperature may be maintained at or below about 400° C. In some embodiments, the precursor may include GeB and the substrate may be maintained at a temperature of between 300° C. and 320° C. in order to deposit a layer having a thickness on the order of 10 nm. In some embodiments, the blocker layer may advantageously improve selectivity at lower epitaxy temperatures (e.g., below about 400° C.) and therefore enable low thermal budget processing.

According to one or more embodiments, the pressure in the Epi chamber is kept relatively low, for example, less than about 50 Torr. Depending on the epitaxial thickness, there may be little or no growth on dielectric surfaces due to the blocker chemistry. If any material grows on the dielectric layer, the material typically has an amorphous structure due to the morphology of the dielectric surface on which the material grows. The material that grows on the semiconductor layer, by contrast, typically has a crystalline structure, if grown on a crystalline semiconductor material. Using the blocker chemistry described herein reduces the growth of amorphous material, for example amorphous silicon (aSi), on the dielectric layer as the crystalline epitaxial layer grows. It is believed that the blocker chemistry may act to reduce, delay, or slow nucleation of epitaxy sites on the dielectric layer. Thus, the result may be a much thinner aSi layer on the dielectric surface compared to the epitaxial layer on the semiconductor surface due to the nucleation delay induced by the blocker chemistry.

In some embodiments, the method 100 continues at optional step 140, wherein a residue layer is removed by exposing the substrate to an etching gas. For example, any aSi on the dielectric surface may be removed. The residue layer may be an amorphous film such as aSi. The aSi may be removed by etch back with HCl, $Cl_2$ or $GeH_4$/HCl. In some embodiments, the aSi may be removed in the Epi chamber.

The method 100 may continue at step 150 wherein the inhibitor species is removed. For example, the inhibitor species may be removed from the dielectric surfaces with an oxidation process. The inhibitor species may be removed in a removal chamber (e.g., ashing chamber, an etch chamber, or a remote plasma oxygen chamber). As would be understood by one of ordinary skill in the art with the benefit of this disclosure, removal of the inhibitor species would not typically be done in the epitaxy chamber, because epitaxy chambers in the semiconductor industry are typically kept oxygen-free. In some embodiments, removal of the inhibitor species may be done in the blocker chemistry chamber. In some embodiments, removal of the inhibitor species may be advanced by inclusion of carbon in the inhibitor species. In some embodiments, the temperature of the substrate during removal of the inhibitor species is low (e.g., less than the temperature during the deposition process). In contrast to sputtering, removal of the inhibitor species may result in a relatively smooth dielectric surface.

In some embodiments, the substrate may then be subjected to downstream processing. In some embodiments, one or more steps of the method 100 may be repeated as an epitaxial process cycle.

Figure 2A:
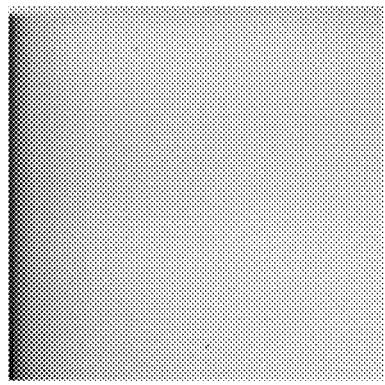
FIGS. 2A-2F show a series of micrographs (2A-2F) illustrating the effects of an inhibitor species in several example experiments.
Figure 2B:
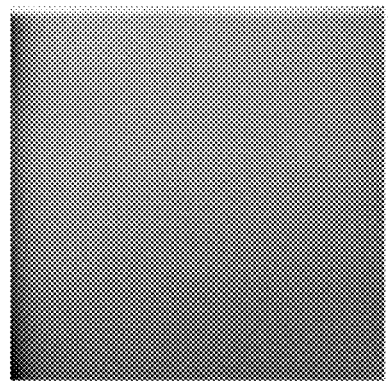
Figure 2C:
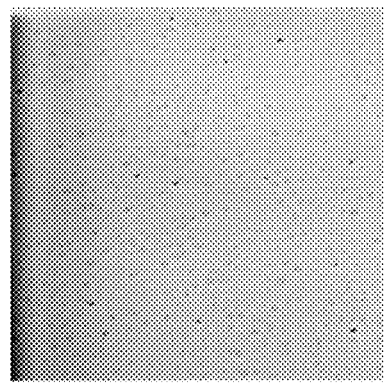
Figure 2D:
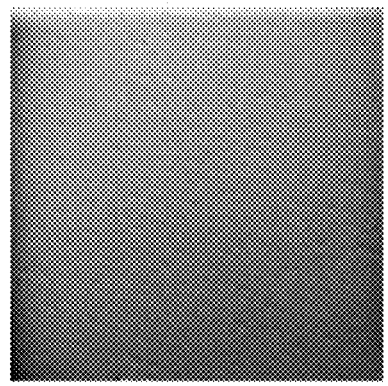
Figure 2E:
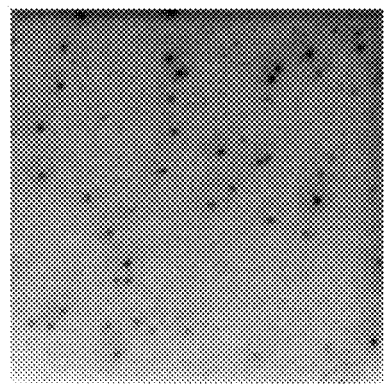
Figure 2F:
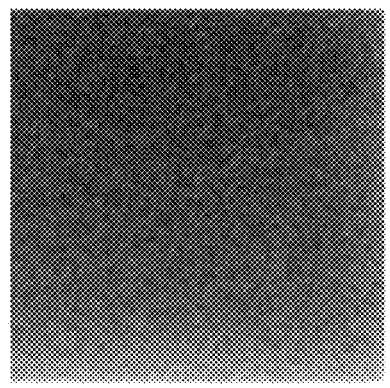

FIGS. 2A-2F show a series of micrographs (2A-2F) illustrating the effects of an inhibitor species in several example experiments. The same GeB epitaxial process applied to test selectivity on different dielectric substrates with or without inhibitor species applied. FIG. 2A shows a substrate with a thermal oxide dielectric layer and a GeB layer on the thermal oxide dielectric layer. No inhibitor was applied to the thermal oxide layer in FIG. 2A. FIG. 2B shows a similar substrate to that of FIG. 2A, except that an inhibitor species was applied to the thermal oxide layer prior to formation of the GeB layer. In this case, GeB process itself is naturally selective to thermal oxide even without inhibitor species applied, and there is no visible deposited GeB nodules observed in FIG. 2A. But GeB process is non-selective to nitride dielectric surface. And nitride dielectric substrate with inhibitor results in a different outcome that the substrate without inhibitor as shown in FIG. 2C-2F. FIG. 2C illustrates a thermal nitride dielectric without an inhibitor species after undergoing GeB deposition. FIG. 2D illustrates a thermal nitride dielectric with an inhibitor species after undergoing GeB deposition. FIG. 2C indicates that visible GeB tiny nodules deposited on the unblocked thermal nitride dielectric. FIG. 2E illustrates an ALD nitride dielectric without an inhibitor species after undergoing GeB deposition. FIG. 2F illustrates an ALD nitride dielectric with an inhibitor species after undergoing GeB deposition. FIG. 2E indicates that visible GeB tiny nodules deposited on the unblocked ALD nitride dielectric. Thus, the selectivity of GeB process is achieved on the nitride dielectric substrates with an appropriate inhibitor material applied. Based on these results, it is possible to control epitaxial deposition on dielectric surfaces of a substrate using the inhibitors available from the blocker chemistry described herein.

While the foregoing is directed to certain embodiments, other and further embodiments may be devised without departing from the basic scope of this disclosure.

What is claimed is:

1. A method of forming a film on a substrate, the method comprising:
   precleaning a substrate, wherein a surface of the substrate comprises silicon surfaces and dielectric surfaces;
   applying an inhibitor species to the surface of the substrate in a first processing chamber such that the inhibitor species preferentially attaches to the dielectric surfaces of the surface of the substrate;
   exposing the substrate having the inhibitor species on the dielectric surfaces thereof to a precursor for epitaxial deposition of a silicon- or germanium- containing layer in a second processing chamber, different than the first processing chamber, while maintaining the substrate at a first temperature of less than about 600 degrees Celsius; and
   removing the inhibitor species from the dielectric surfaces with an oxidation process in a third processing chamber, different than the second processing chamber, while maintaining the substrate at a second temperature that is lower than the first temperature.

2. The method of claim 1, wherein the precursor comprises at least one of a silicon source or a germanium source.

3. The method of claim 2, wherein the precursor comprises at least one of a carbon source or a dopant source.

4. The method of claim 1, further comprising depositing a silicon-containing epitaxial layer comprising phosphorus on the substrate.

5. The method of claim 1, further comprising depositing a germanium-containing epitaxial layer comprising boron on the substrate.

6. The method of claim 1, wherein applying the inhibitor species comprises exposing the substrate to at least one of trichlorosilane, trialkoxysilanes, silylamines, carbon, or a polymer.

7. The method of claim 1, further comprising removing at least one of amorphous silicon or amorphous germanium from the dielectric surfaces.

8. The method of claim 7, wherein the removing the at least one of amorphous silicon or amorphous germanium comprises exposing the substrate to an etching gas.

9. The method of claim 1, further comprising removing at least one of amorphous silicon or amorphous germanium from the dielectric surfaces before removing the inhibitor species from the dielectric surfaces.

10. The method of claim 1, further comprising pre-baking the substrate in the second processing chamber.

11. The method of claim 1, further comprising pre-baking the substrate in a fourth processing chamber.

12. The method of claim 1, wherein the precleaning is performed in a preclean chamber.

\* \* \* \* \*